(12) United States Patent
Jun et al.

(10) Patent No.: US 9,807,693 B2
(45) Date of Patent: Oct. 31, 2017

(54) METHOD FOR MINIMIZING POWER CONSUMPTION AND ELECTRONIC DEVICE IMPLEMENTING THE SAME

(71) Applicant: Samsung Electronics Co., Ltd., Suwon-si, Gyeonggi-do (KR)

(72) Inventors: Intae Jun, Daegu (KR); Yonghune An, Gumi-si (KR); Jeeon Park, Gumi-si (KR); Cheoleun Heo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 14/849,994

(22) Filed: Sep. 10, 2015

(65) Prior Publication Data
US 2016/0081026 A1    Mar. 17, 2016

(30) Foreign Application Priority Data

Sep. 11, 2014    (KR) .................. 10-2014-0120119

(51) Int. Cl.
| | | |
|---|---|---|
| *G08C 17/00* | (2006.01) | |
| *H04W 52/02* | (2009.01) | |
| *H04B 1/16* | (2006.01) | |
| *H03G 3/30* | (2006.01) | |

(52) U.S. Cl.
CPC ...... *H04W 52/0245* (2013.01); *H03G 3/3042* (2013.01); *H03G 3/3052* (2013.01); *H04B 1/16* (2013.01); *Y02B 60/50* (2013.01)

(58) Field of Classification Search
CPC . H04W 52/00; H04W 52/02; H04W 52/0206; H04W 52/0209; H04W 52/0225; H04W 52/0299; H04W 52/0245; H03G 3/3042; H03G 3/3052; H04B 1/16; Y02B 60/50
See application file for complete search history.

(56) References Cited

U.S. PATENT DOCUMENTS

| | | | | |
|---|---|---|---|---|
| 5,564,087 A * | 10/1996 | Cygan | ...................... | H03F 1/34 455/115.1 |
| 5,652,544 A * | 7/1997 | Fink | ......................... | H03G 3/00 330/129 |
| 6,813,510 B1 * | 11/2004 | Kunzinger | ........... | H03G 3/3052 327/91 |
| 8,229,373 B2 * | 7/2012 | Tanoue | ................ | H03F 1/0261 455/114.1 |
| 8,457,029 B2 | 6/2013 | Vaidya et al. | | |
| 2004/0009758 A1 * | 1/2004 | Graham | ............... | H03G 3/3052 455/234.1 |
| 2005/0003783 A1 * | 1/2005 | Ben-Ayun | ............ | H03G 3/3078 455/232.1 |
| 2005/0078775 A1 * | 4/2005 | Hellmark | ............... | H03G 3/001 375/345 |

(Continued)

Primary Examiner — Kevin Mew
(74) Attorney, Agent, or Firm — Jefferson IP Law, LLP

(57) ABSTRACT

A method of minimizing power consumption of an electronic device is provided. The method includes receiving a signal through a plurality of receivers of the electronic device, checking a status of the received signal, determining whether the received signal satisfies a preset amplifier control condition based on the status of the received signal, and adjusting a gain of an amplifier, which is connected to a receiver of the plurality of receivers, in response to the preset amplifier control condition when the preset amplifier control condition is satisfied.

14 Claims, 4 Drawing Sheets

(56) References Cited

U.S. PATENT DOCUMENTS

| | | | |
|---|---|---|---|
| 2006/0046642 A1* | 3/2006 | Bassiri | H04B 7/15535 |
| | | | 455/7 |
| 2006/0209997 A1* | 9/2006 | Van Buren | H03G 3/3042 |
| | | | 375/345 |
| 2007/0165744 A1* | 7/2007 | Ishida | H03G 3/3042 |
| | | | 375/296 |
| 2007/0188235 A1* | 8/2007 | Dean | H04B 7/15578 |
| | | | 330/278 |
| 2009/0227222 A1* | 9/2009 | Lu | H03G 3/3052 |
| | | | 455/234.1 |
| 2010/0264984 A1* | 10/2010 | Gomez | H03F 1/52 |
| | | | 330/124 R |
| 2011/0148519 A1* | 6/2011 | Drogi | H03F 3/24 |
| | | | 330/129 |
| 2012/0091799 A1* | 4/2012 | Rofougaran | H02J 1/10 |
| | | | 307/24 |
| 2012/0169424 A1* | 7/2012 | Pinarello | H03F 1/0272 |
| | | | 330/285 |
| 2013/0242836 A1 | 9/2013 | Vaidya et al. | |
| 2015/0249965 A1* | 9/2015 | Dussmann | H03G 3/3042 |
| | | | 455/501 |

\* cited by examiner

METHOD FOR MINIMIZING POWER CONSUMPTION AND ELECTRONIC DEVICE IMPLEMENTING THE SAME

CROSS-REFERENCE TO RELATED APPLICATION(S)

This application claims the benefit under 35 U.S.C. §119(a) of a Korean patent application filed on Sep. 11, 2014 in the Korean Intellectual Property Office and assigned Serial number 10-2014-0120119, the entire disclosure of which is hereby incorporated by reference.

TECHNICAL FIELD

The present disclosure relates to a method of minimizing power consumed in an electronic device and an electronic device implementing the same.

BACKGROUND

An electronic device which can perform wireless communication may receive a radio frequency (RF) modulation signal, transmitted by a transmitter through various propagation paths. In general, as the number of antennas built into the electronic device increases, the electronic device may receive a signal through various propagation paths, which may improve a signal reception performance of the electronic device.

A multi-input multi-output (MIMO) system is a system which is developed to be used in a wireless communication system that requires high-capacity data transmission. The MIMO system may be a system which receives a signal through multiple antennas, and transmits a signal through multiple antennas. Since the MIMO system may transmit and receive a signal through various propagation paths, the MIMO system may transmit and receive a signal with a more improved performance in comparison with a single input and output system. For example, the electronic device of a MIMO system may achieve a high-speed wireless communication as multiple antennas operate simultaneously. An electronic device of a MIMO system may transmit more data than a single-input single output (SISO) system by transmitting a different signal for each transmission antenna.

The electronic device of a MIMO system may receive a signal through multiple antennas, and may apply and process a separate algorithm to the signal received through multiple antennas. In addition, the electronic device may transmit the processed signal through the multiple antennas. Since the MIMO system is able to operate the multiple antennas simultaneously to transmit and receive a signal, the MIMO system can process more data more quickly during a certain period of time in comparison with the SISO system.

Since the MIMO based electronic device transmits and receives signals through various propagation paths, it is necessary to optimize a transmitting and receiving signal level in response to a change of communication environment. In this case, the electronic device may use an amplifier so as to optimize the signal level. In general, the electronic device may consume a lot of power to operate the amplifier. The power consumption of the MIMO based electronic device may be large, because of the characteristics of a configuration that uses multiple amplifiers. For instance, the MIMO based electronic device may operate continuously the multiple amplifiers connected to the multiple antennas, and may consume more power through the operated multiple amplifiers. Since the MIMO based electronic device controls the multiple amplifiers simultaneously, an amplifier which does not need to be operated according to a status of signal may be operated continuously. Hence, more power may be wasted.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method of minimizing power consumption and an electronic device implementing the same, which is capable of adjusting a gain of an amplifier built into an electronic device based on a multi-input multi-output (MIMO) system to minimize power wasted by an unused amplifier.

In accordance with an aspect of the present disclosure, a method of minimizing power consumption is provided. The method includes receiving a signal through a plurality of receivers of the electronic device, checking a status of the received signal, determining whether the signal satisfies a preset amplifier control condition based on the status of the received signal, and adjusting a gain of an amplifier which is connected to a receiver of the plurality of receivers in response to the preset amplifier control condition when the preset amplifier control condition is satisfied.

In accordance with another aspect of the present disclosure, an electronic device is provided. The electronic device includes a wireless communication unit including a plurality of receivers, and configured to transmit and receive a signal through the plurality of receivers, a memory configured to store a preset amplifier control condition which is previously set by a developer and a user, and a controller configured to receive the signal through the plurality of receivers, check a status of the received signal, determine whether the signal satisfies the preset amplifier control condition based on the status of the received signal, and adjust a gain of an amplifier which is connected to a receiver of the plurality of receivers in response to the amplifier control condition when the amplifier control condition is satisfied.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
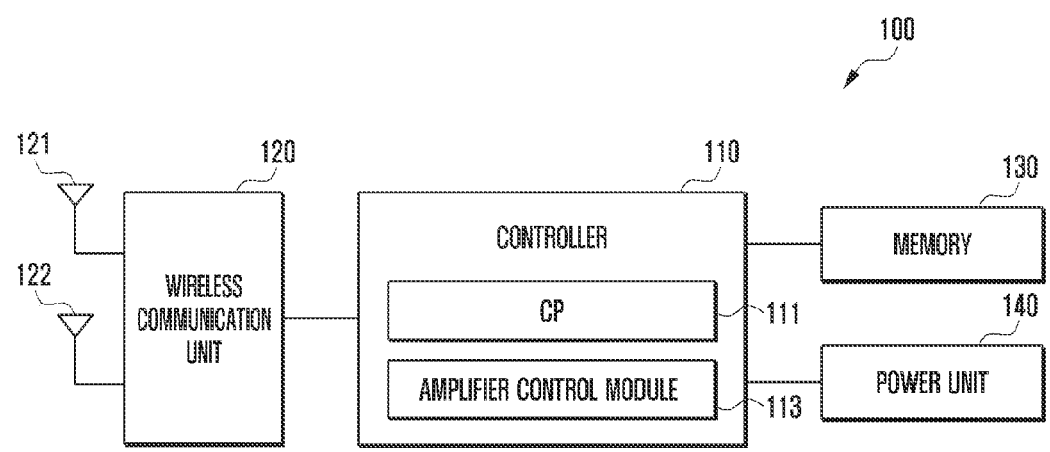
FIG. 1 is a block diagram illustrating an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The suffix for constituent elements "module" and "unit" used in various embodiments is given merely in consideration of easy of creation of the present disclosure, and does not give a particularly important meaning or role per se. Accordingly, it should be noted that the terms "module" and "unit" may be used interchangeably with each other.

The expressions such as "include" or "may include" which may be used in various embodiments of the present disclosure denote the presence of the disclosed functions, operations, and constituent elements and do not limit one or more additional functions, operations, and constituent elements. In various embodiments of the present disclosure, the terms such as "include" and "have" may be construed to denote a certain characteristic, number, operation, constituent element, component or a combination thereof, but may not be construed to exclude the existence of or a possibility of addition of one or more other characteristics, numbers, operations, constituent elements, components or combinations thereof.

Furthermore, in various embodiments of the present disclosure, the expression "or" includes any and all combinations of the associated listed words. For example, the expression "A or B" may include A, may include B, or may include both A and B.

In various embodiments of the present disclosure, expressions including ordinal numbers, such as "first," "second" or the like may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of the first user device and the second user device are user devices. For example, a first element could be termed a second element, and similarly, a second element could be also termed a first element without departing from the scope of various embodiments of the present disclosure.

The expression "check a status of signal" used in various embodiments of the present disclosure may mean "check whether a signal received in an electronic device is a streaming video, an image file or a message file." In addition, the expression "check a status of signal" may mean "check a communication environment." That is, "check a status of signal" may mean "check a type of signal," "check a communication environment at the present time," or "check a priority which is previously set by a developer and a user when a plurality of different signals are received."

In this case, the preset priority may be a priority which is previously set to operate an electronic device based on a streaming video signal when the streaming video signal and a message signal are received simultaneously. For example, the electronic device according to the present disclosure may use only some amplifiers among the plurality of built-in amplifiers when receiving a message signal.

In this case, when receiving a streaming video signal, the electronic device is able to receive and process the signal only when all of the built-in amplifiers are used. In preparation for such a case, the developer and the user may previously set a priority in response to the signal received in the electronic device. Therefore, when receiving the message signal and the streaming video signal simultaneously, the electronic device may use amplifier in response to the streaming video signal which has a higher priority than the message signal. The electronic device may check a signal which is to be processed preferentially among the plurality of different signals according to the priority which is previously set by the developer and the user.

Unless defined otherwise, the terms including technical and scientific terms used in the present disclosure may have the meaning that can be commonly apprehended by those skilled in the art. The terms, such as the terms defined in the commonly-used dictionary, must be interpreted based on the context of the related technology and must not be interpreted ideally or excessively.

An electronic device according to various embodiments of the present disclosure may include, for example, at least one of a smartphone, a tablet personal computer (PC), a mobile phone, a video phone, an e-book reader, a desktop PC, a laptop PC, a netbook computer, a personal digital assistant (PDA), a portable multimedia player (PMP), a Moving Picture Experts Group phase 1 or phase 2 (MPEG-1 or MPEG-2) audio layer 3 (MP3) player, a mobile medical device, a camera, or a wearable device (e.g., head-mounted display (HMD) like an electronic glasses, an electronic clothes, an electronic bracelet, an electronic necklace, an electronic appcessory, an electronic tattoo, or a smartwatch).

Hereinafter, an electronic device according to various embodiments of the present disclosure is illustrated with reference to the accompanying drawings. The term "user" used in various embodiments of the present disclosure may refer to a person who uses an electronic device or a device (e.g., artificial intelligence electronic device) that uses an electronic device.

More specifically, FIGS. 1 through 3, discussed below, and the various embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the present disclosure. Terms first, second, and the like are used to differentiate between objects having the same terminology and are in no way intended to represent a chronological order, unless where explicitly stated otherwise. A set is defined as a non-empty set including at least one element.

FIG. 1 is a block diagram illustrating an electronic device according to an embodiment of the present disclosure.

Referring to FIG. 1, an electronic device 100 is illustrated, where the electronic device 100 may include a controller 110, a wireless communication unit 120, memory 130 and a power unit 140.

Each of the aforementioned elements is connected to each other by a bus, and the controller 110 may send a signal (e.g., a control message) to the elements to control the elements.

The controller 110 may usually control the overall operation of the electronic device 100. For example, the controller 110 may receive an instruction from aforementioned other elements (e.g., wireless communication unit 120, memory 130 and power unit 140) through the bus, decode the received instruction, and execute an operation or data processing according to the decoded instruction. In addition, the controller 110 may include a communication processor (CP) 111 and an amplifier control module 113. That is, the controller 110 may control the amplifier which is built into the electronic device 100 through the amplifier control module 113. Here, the amplifier may include a power amplifier (PA), a low noise amplifier (LNA) and a programmable gain amplifier (PGA). When a path for receiving or transmitting a signal through an antenna is divided into a receiver and a transmitter respectively, the receiver of electronic device according to the present disclosure may include the LNA and the PGA, and the transmitter may include the PA and the PGA. Then, the controller 110 may adjust the gain of the amplifiers which are connected to the receiver and the transmitter.

The CP 111 may enable the electronic device 100 to be connected with other electronic device, when communicating with other electronic device in a wireless communication system. That is, the CP 111 may perform a secondary role in comparison with the controller 110 of the electronic device 100. For instance, the CP 111 may convert a received signal in the middle between the wireless communication unit 120 and the controller 110 so that the controller 110 may process the signal received through the wireless communication unit 120. The CP 111 may serve to process communication in the electronic device 100 such that the load of the controller 110 may be reduced. The CP 111 may be manufactured in the form of system on chip (SOC) or may be manufactured separately from the controller 110.

The amplifier control module 113 may adjust the gain of the PA (e.g., a PA device), the LNA (e.g., an LNA device) and the PGA (e.g., a PGA device) which are built into the electronic device 100. Here, the gain is a value indicating a degree of signal amplification, and may be represented by using a decibel (dB) as a unit. A dB may be a value obtained by taking the logarithm of a ratio of input signal to output signal and being multiplied by ten. For example, 20 dB signal may be a signal which is amplified by ten times in comparison with 10 dB signal. The controller 110 of the electronic device 100 may receive a signal from other electronic device (e.g., a server, an external electronic device, etc.), and amplify the received signal by gain using a gain adjusted amplifier.

The PA is a power amplifier, and in particular, a high-frequency amplifier which is disposed in a transmitter and supplies power to antenna may be referred to as a last stage PA. The PA may be classified into a low-frequency PA and a high-frequency PA based on a treated frequency. The PA may accomplish a low distortion of signal and serve to supply power with high efficiency. The PA may be disposed in the transmitter rather than in the receiver and may amplify the intensity of the transmission signal to transmit to the antenna.

The LNA may amplify the signal while suppressing the noise included in the signal via a low-noise amplifier. The LNA may be a high frequency amplifier (e.g., a radio frequency (RF) amplifier) to lower a noise factor of a signal. The LNA may be used in a received radio signal which has a large propagation loss. That is, the LNA may be disposed in the receiver and may amplify the intensity of the noise while lowering the noise factor of the signal received through the antenna. The LNA may be a parameter amplifier, a low noise transistor amplifier, a major amplifier and the like. The amplifier control module 113 may adjust the gain of the LNA. When the gain of the LNA is adjusted to 0 dB, the LNA may be only supplied with a direct current (DC) voltage to be supplied with a very low power. The state in which the gain of the LNA is adjusted to 0 dB may be similar to the state in which the LNA is not operated. That is, the LNA having a gain which is adjusted to 0 dB may consume little power.

The PGA is one of operational amplifier, and may control the intensity of external digital signal and analog signal. For example, the PGA may control the intensity of the signal under the control of the controller 110. The controller 110 may adjust the gain of the PGA to 0 dB, and the PGA which is adjusted to 0 dB may be supplied with little power. Since the electronic device 100 consumes a large amount of power through the amplifier (e.g., the LNA, or the PGA), the electronic device 100 may minimize power consumed by the amplifier when the gain of the amplifier is adjusted to 0 dB. The electronic device 100 according to the present disclosure may control the gain of the amplifier which operates independently of the processing of the received signal, thereby minimizing the power which is wasted through the amplifier.

The wireless communication unit 120 may include one or more elements which make it possible to accomplish a wireless communication between the electronic device 100 and a wireless communication system or a wireless communication between the electronic device 100 and a network in which other electronic device is located. Although not shown, the wireless communication unit 120 may include a cellular module, a Wi-Fi module, a Bluetooth (BT) module, a global positioning system (GPS) module, a near field communication (NFC) module and an RF module.

The cellular module may provide a voice call, a video call, a Short Message Service and an Internet service through a communication network (e.g., long term evolution (LTE), LTE-advanced (LTE-A), code division multiple access (CDMA), wideband CDMA (WCDMA), universal mobile telecommunications system (UMTS), wireless broadband (WiBro) and global system for mobile communications (GSM), etc.). In addition, the cellular module may perform a distinction and an authentication of the electronic device 100 in the communication network by using a subscriber identification module (SIM) card. In an embodiment of the present disclosure, the cellular module may include a CP, and may be implemented as an SoC.

The Wi-Fi module, the BT module, the GPS module, and the NFC module may include a processor for processing transmitting and receiving data. At least a portion (e.g., two or more) of the above-described respective modules (e.g., a Wi-Fi module, a BT module, a GPS module, and an NFC module) may be included in a single integrated chip (IC) or an IC package.

The RF module may perform data transmission and reception, e.g., RF signal transmission and reception. That is, the RF module may wirelessly transmit the data stored in the memory 130 to an external terminal, or may transmit the data to a web page through a linkage with an external web server. The RF module may include a transceiver, a power amp module (PAM), a frequency filter, an LNA, a PA, a PGA and a local oscillator (LO). In addition, the RF module may further include components (e.g., a conductor, a wire, etc.) for transmitting and receiving an electromagnetic wave on a free space in a wireless communication environment.

The wireless communication unit 120 may include a plurality of antennae. The electronic device 100 according to the present disclosure illustrates two antennae, but is not limited thereto. The plurality of antennae may be divided into a first antenna 121 and a second antenna 122. The plurality of antennae 121, 122 may be connected to the transmitter and the receiver respectively, and may transmit a received signal to the outside of the electronic device through the transmitter, and transmit the signal received from the outside of the electronic device to the receiver. The wireless communication unit 120 may transmit and receive a signal using the first antenna 121 and the second antenna 122. When signals are transmitted and received using the first antenna 121 and second antenna 122 simultaneously, more data can be transmitted and received more quickly than transmitting and receiving signals by using only a single antenna.

The memory 130 may include an internal memory (not shown) or an external memory (not shown). The internal memory may include at least one of, for example, a volatile memory (e.g., dynamic random access memory (DRAM), static RAM (SRAM), synchronous DRAM (SDRAM), etc.) or a non-volatile memory (e.g., one time programmable read only memory (OTPROM), PROM, erasable and programmable ROM (EPROM), electrically erasable and programmable ROM (EEPROM), mask ROM, flash ROM, NAND flash memory, NOR flash memory, etc.).

The internal memory may be a solid state drive (SSD). The external memory may further include a flash drive such as a compact flash (CF), a secure digital (SD), a micro-SD memory card, a mini-SD memory card, an extreme digital (xD) memory card or a memory stick, etc. The external memory may be operatively coupled to the electronic device 100 through various interfaces. The memory 130 may store a plurality of information items required by the controller 110 to operate the electronic device 100. In detail, the memory 130 may store information which is required by the amplifier module 113 to control the amplifier (e.g., the PA, the LNA, or the PGA). In addition, the memory 130 may store reference information to determine whether to control the amplifier. That is, the memory 130 may store information on an amplifier control condition previously set by the developer and the user. The amplifier control condition may be a condition for controlling the amplifier based on the status of the received signal. For example, when it is necessary to process a large amount of data such as a high definition streaming video, the controller 110 may control the amplifier to receive and process signals through all of the built-in receivers. However, when the amount of data to be processed is not large, as in the case of a message, the controller 110 may control the amplifier to receive and process signals by selectively using only a portion of a plurality of receivers. Thus, the amplifier control condition may be a condition for controlling some or the whole of the amplifiers built into the electronic device 100 based on the status of the received signal.

The power unit 140 may include, for example, a power management integrated circuit (PMIC), a charger IC, a battery or a fuel gauge. The controller 110 may supply power to the electronic device 100 through the power unit 140, and specifically, supply power necessary to operate respective elements (e.g., LNA, PGA and PA) of the electronic device 100.

Figure 2A:
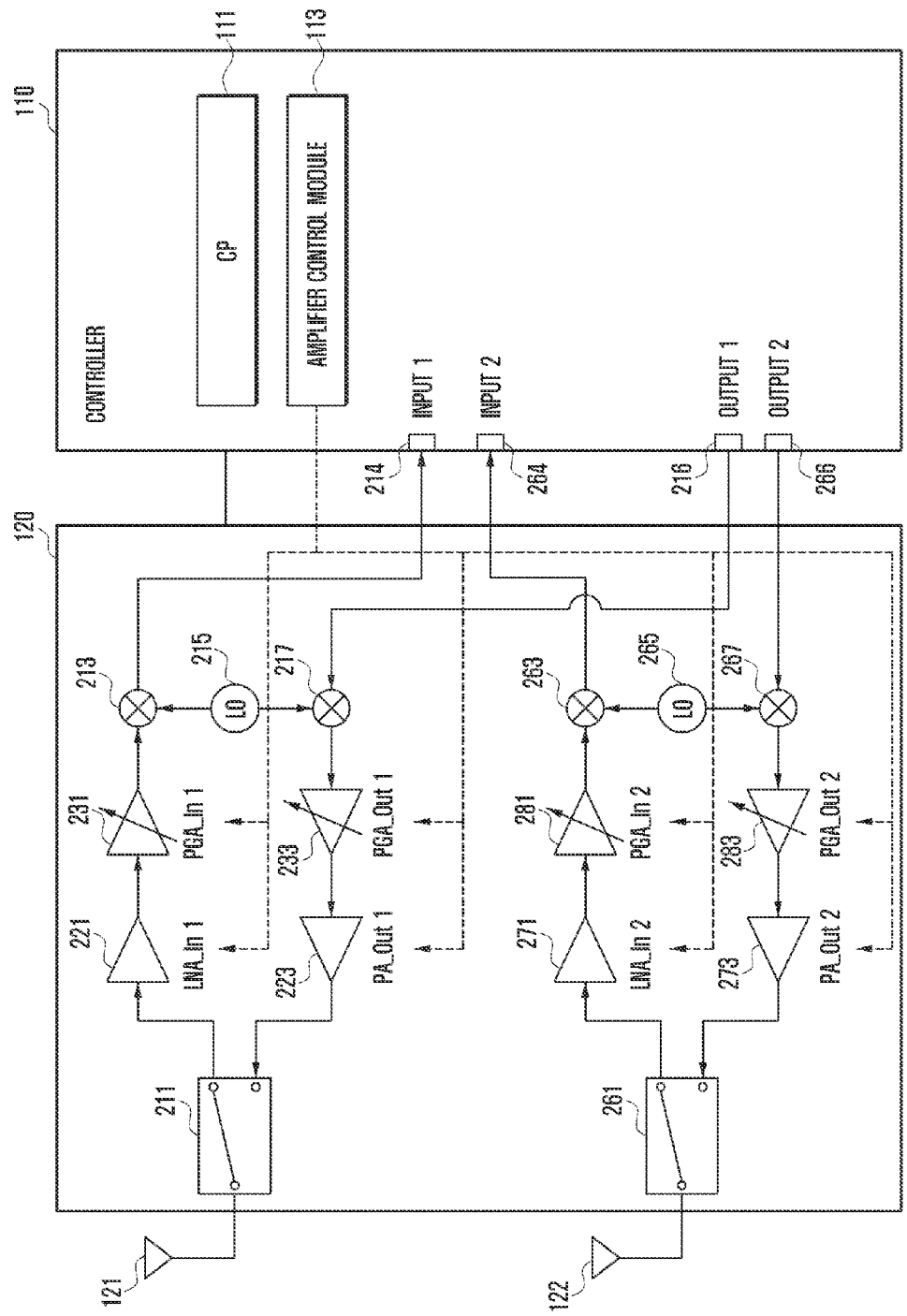
FIGS. 2A and 2B are circuit diagrams illustrating an operation of a wireless communication unit according to various embodiments of the present disclosure.
Figure 2B:
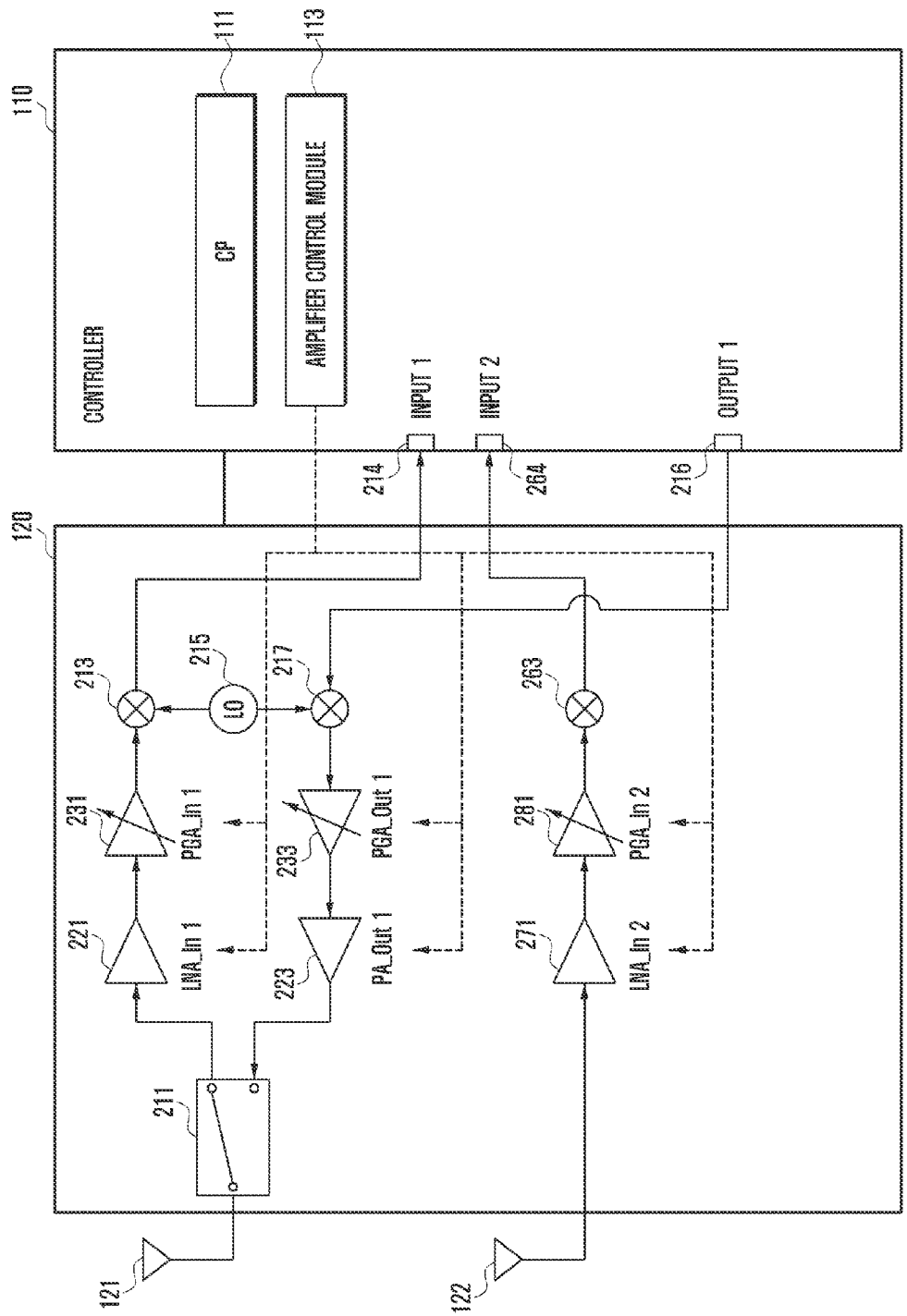

FIGS. 2A and 2B are circuit diagrams illustrating an operation of a wireless communication unit according to various embodiments of the present disclosure.

FIG. 2A is a circuit diagram illustrating an operation of wireless communication unit in a multi-input multi-output (MIMO) system.

Referring to FIG. 2A, a wireless communication unit 120 and a controller 110 are illustrated, where the wireless communication unit 120 may be configured of a plurality of antennae (e.g., a first antenna 121, a second antenna 122), an amplifier (e.g., a PA, an LNA, or a PGA), an oscillator and a mixer.

FIG. 2A illustrates two antennae including the first antenna 121 and the second antenna 122, but not limited thereto. The controller 110 may transmit and receive signals through the first antenna 121 and the second antenna 122. In detail, the controller 110 may receive a signal through the receiver connected to the first antenna 121 and the second antenna 122, and transmit a signal through the transmitter connected to the first antenna 121 and the second antenna 122. The first antenna 121 may be connected to a first switch 211. The controller 110 may control the first switch 211 to accomplish transmission and reception of signals through the first antenna 121.

A signal which is received through the first antenna 121 is defined as a first signal, and a signal which is received through the second antenna 122 is defined as a second signal. In addition, a signal which is transmitted through the first antenna 121 is defined as a third signal, and a signal which is transmitted through the second antenna is defined as a fourth signal. The devices which are used to receive the first signal may be classified as a first receiver, the devices which are used to receive the second signal may be classified as a second receiver, the devices which are used to transmit the third signal may be classified as a first transmitter, and the devices which are used to transmit the fourth signal may be classified as a second transmitter.

A strength of the first signal received through the first antenna 121 may be amplified through an LNA_In 1 device 221. In this case, a degree of amplification may be determined based on a gain set on the LNA_In 1 device 221.

An amplifier control module 113 included in the controller 110 may adjust the gain of the LNA_In 1 device 221. Hereinafter, the gain of all amplifiers included in the wireless communication unit 120 may be adjusted by the amplifier control module 113. The LNA_In 1 device 221 is an LNA, which can amplify a signal while reducing the noise of the signal. The strength of the first signal amplified through the LNA_In 1 device 221 may be adjusted again by a PGA_In 1 device 231.

In this case, the PGA_In 1 device 231 is a programmable gain amplifier, which can adjust the strength of a signal. The frequency of the first signal having the strength which is adjusted by the PGA_In 1 device 231 may be adjusted by a frequency signal generated by a first LO 215. Here, the LO may create a specific frequency source, and may enable the received signal to be adjusted to a desired frequency by a mixer. A first mixer 213 may combine the frequency of the first signal which passed through the PGA_In 1 device 231 and the frequency of the signal generated by the first LO 215 to convert the frequency of the first signal into a specific frequency. Here, the specific frequency may be a frequency that can be received by the electronic device 100. That is, the first signal may be converted into a specific frequency that can be received by the electronic device 100 through the first LO 215 and the first mixer 213.

In summary, the controller 110 may receive the first signal through a first receiver including the LNA_In 1 device 221, the PGA_In 1 device 231 and the first mixer 213. Here, the first receiver may include the LNA_In 1 device 221, the PGA_In 1 device 231 and the first mixer 213, and may be a reception path of the first signal received from the antenna.

The controller 110 may receive the first signal which is converted to a specific frequency through a first input (INPUT 1) terminal 214. In detail, a CP 111 included in the controller 110 may receive the first signal, and may process the first signal to transmit to controller 110. The CP 111 included in the controller 110 may receive the second signal through the second antenna 122 while simultaneously receiving a signal through the first antenna 121. That is, the first signal and the second signal may be received simultaneously through the first antenna 121 and the second antenna 122.

The controller 110 may control a second switch 261 so that a second signal may be received through the second antenna 122. The strength of the second signal received through the second antenna 122 may be amplified through an LNA_In 2 device 271. Similarly to the above mentioned LNA_In 1 device 221, the LNA_In 2 device 271 may also determine the degree of amplification of the signal based on a preset gain. The strength of the second signal amplified through the LNA_In 2 device 271 may be adjusted again by a PGA_In 2 device 281. The frequency of the second signal may be adjusted by a frequency signal generated by a second LO 265. In FIG. 2, the LO is divided into the first LO 215 and the second LO 265, but the LO may be configured as one. A third mixer 263 may combine the frequency of the second signal and the frequency of the signal generated by the second LO 265 to convert the frequency of the second signal into a specific frequency.

Similarly to the first signal, the second signal may be converted into a specific frequency that can be received by the electronic device 100. The controller 110 may receive the second signal which is converted to the specific frequency through a second input (INPUT 2) terminal 264. In detail, the CP 111 included in the controller 110 may receive the second signal, and may process the second signal to transmit to controller 110. The CP 111 may transmit the above-mentioned first signal and the second signal to the controller 110 simultaneously. Although not shown, the controller 110 may combine the first signal received through the first input terminal 214 with the second signal received through the second input terminal 264, and may process the combined signal. That is, since the controller 110 receives a signal by two antennas and combines and processes two received signals, the controller 110 can process video and streaming services having large amounts of data to be processed more quickly.

When transmitting a signal, the controller 110 may process the signal contrary to the process of receiving the signal. The controller 110 may transmit the signal to a second mixer 217 and a fourth mixer 267 through a first output (OUTPUT 1) 216 and a second output (OUTPUT 2) terminal 266. The frequency of the signal which is received by the second mixer 217 may be adjusted by a frequency signal generated by the first LO 215. The strength of the signal having the adjusted frequency may be amplified through a PGA_Out 1 device 233 and a PA_Out 1 device 223. Here, the PA_Out 1 device 223 is a PA, which serves to amplify the signal of the transmitter to transmit to the antenna. The signal amplified through the PGA_Out 1 device 233 and the PA_Out 1 device 223 may be transmitted to the outside through the first antenna 121. The signal transmitted to the fourth mixer 267 may be processed in the same way as the operation of processing the signal transmitted to the second mixer 217. The frequency of the signal received from the fourth mixer 267 may be adjusted by a frequency signal generated by the second LO 265. The signal having the adjusted frequency may be amplified through a PGA_Out 2 device 283 and a PA_Out 2 device 273. The signal amplified through the PGA_Out 2 device 283 and the PA_Out 2 device 273 may be transmitted to the outside through the second antenna 122.

FIG. 2B is a circuit diagram illustrating an operation of a wireless communication unit in a multi-input single-output (MISO) system. The electronic device according to various embodiments of the present disclosure may perform a method of minimizing power consumption in a MISO system as well as in a MIMO system. In comparison with FIG. 2A, in FIG. 2B, one output terminal (the second output terminal 266 of FIG. 2A) and one LO (the second LO 265 of FIG. 2A) are omitted, and two paths of the transmission signal are reduced to a single path. Similarly to FIG. 2A, the amplifier control module 113 included in the controller 110 may adjust the gain of the amplifier (e.g., PA, LNA, PGA) which is built into the wireless communication unit 120. For example, the amplifier control module 113 may adjust the gain of the amplifier to 0 dB to minimize the power consumed by the amplifier. Little power may be consumed by the amplifier which is adjusted to 0 dB.

Referring to FIG. 2B, the operation of receiving a signal using the first antenna 121 and the second antenna 122 is identical with the operation in FIG. 2A, as such, redundant descriptions thereof are omitted.

However, when transmitting a signal, the controller 110 may transmit the signal to the second mixer 217 through the first output terminal 216. The frequency of the signal received by the second mixer 217 may be adjusted by a frequency signal generated by the first LO 215. The signal having the adjusted frequency may be amplified through the PGA_Out 1 device 233 and the PA_Out 1 device 223. The signal which is amplified through the PGA_Out 1 device 233 and the PA_Out 1 device 223 may be transmitted to the outside through the first antenna 121. When transmitting a signal in the MISO system, the electronic device 100 may transmit the signal to the outside through a single antenna (e.g., the first antenna 121 of FIG. 2B).

Figure 3:
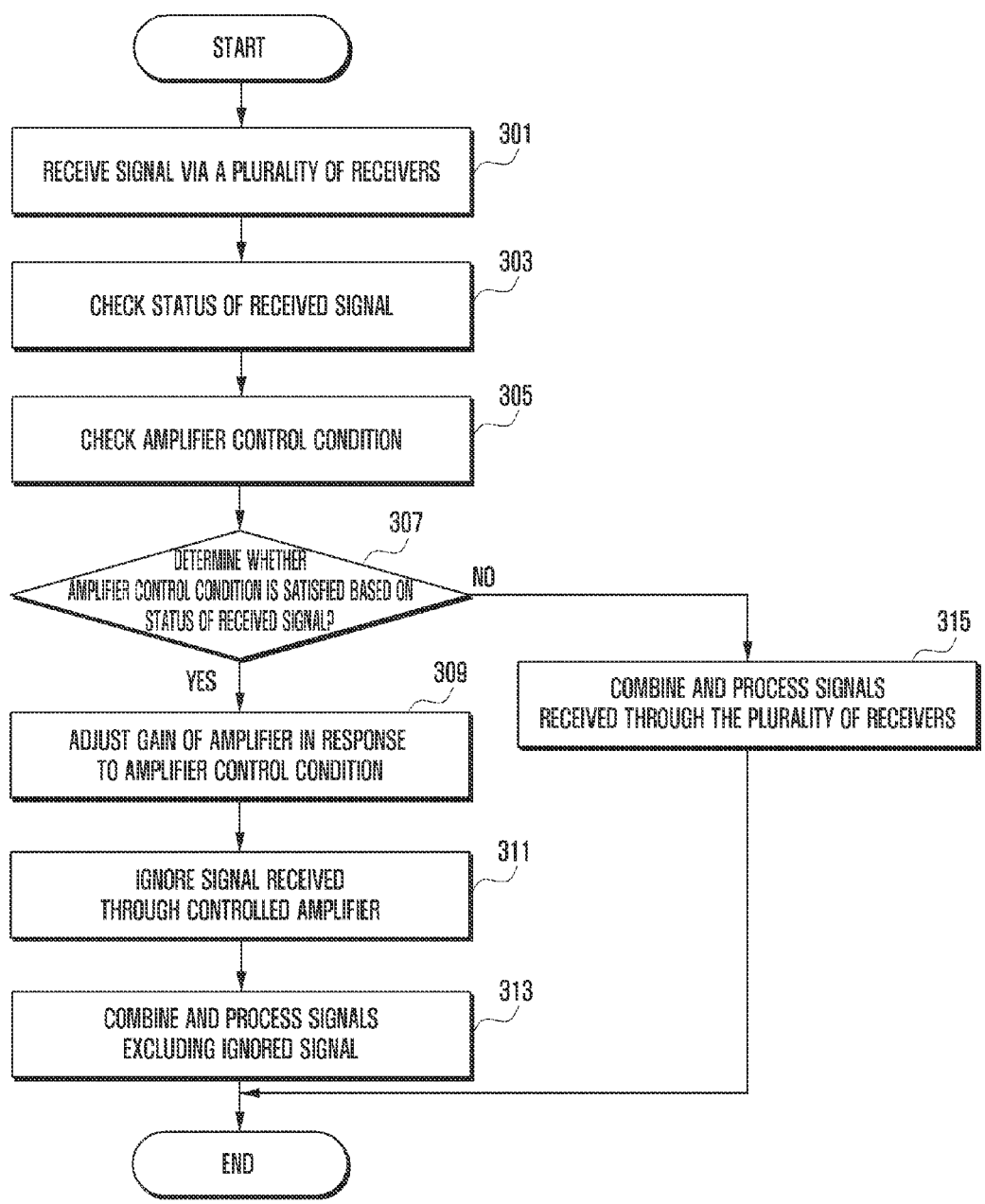
FIG. 3 is a flowchart illustrating a method for minimizing power consumption in an electronic device according to an embodiment of the present disclosure.

FIG. 3 is a flowchart illustrating a method for minimizing power consumption in an electronic device according to an embodiment of the present disclosure.

Referring to FIG. 3, a flowchart illustrated a method for minimizing power consumption is illustrated, such that at operation 301, the controller 110 of the electronic device 100, as illustrated in FIG. 1, may receive a signal through a plurality of receivers.

The electronic device 100 may be equipped with at least one built-in antenna, and the antenna may perform transmission and reception of a signal through a switch. In this case, the grouping of devices along the path for transmitting a signal may be defined as the transmitter, and the grouping of devices along the path for receiving a signal may be defined as the receiver. That fact that the controller 110 may receive a signal through a plurality of receivers may mean that signals may be transmitted and received based on a MIMO system or a MISO system. The "multiple-input" may mean that the receiver for receiving a signal is plural, and the "multiple-output" may mean that the transmitter for transmitting a signal is plural. In the case of using two or more receivers, the controller 110 may have more paths for receiving a signal than in the case of using one receiver, and may process the received signal more efficiently. That is, in the case of using two or more receivers, the controller 110 may process a large amount of data more quickly than in the case of using one receiver.

At operation 303, the controller 110 may check the status of the received signal. For example, the controller 110 may check whether the received signal is a streaming video, a message file or an image file based on a "status of signal." In addition, the controller 110 may check the communication environment at the present time. That is, the checking of the "status of signal" may mean checking the communication environment at the present time together with the type of the received signal.

Here, a data amount of signal is described as an example so as to understand the meaning of "communication environment" more clearly. The checking of the "communication environment" may mean checking the status of processing the data amount of signal per second at the present time. The controller 110 may check the data amount of signal that can be received and processed per second through one receiver based on the communication environment. That is, the "communication environment" may mean an environment which can be decided in consideration of the performance of an electronic device 100 and the status of a wireless communication system and can achieve communication.

Further, the electronic device 100 may decide the data amount of a signal which can be received and processed per second based on the communication environment, and then, based on the decided data amount of the signal, may decide the number of the receiver to be used. That is, at operation 303, the controller 110 may check the "status of signal" including the type of signal and the communication environment. In addition, the checking of the "status of signal" may mean checking a priority which is previously set by a developer and a user, with respect to the received signal. For example, when receiving a plurality of different signals simultaneously, the plurality of different received signals may be a streaming video signal, and a text message signal.

The controller 110 may control the amplifier built into the electronic device 100 based on the higher priority signal, between the streaming video signal and the text message signal, according to the priority which is previously set by the developer and the user. For example, the streaming video signal may be a signal that can be received and processed by using two receivers among the plurality of receivers built into the electronic device 100.

On the other hand, the text message signal may be a signal that can be received and processed by using only one receiver among the plurality of receivers built into the electronic device 100. At this time, the priority of the streaming video signal may be set higher than the priority of the text message signal by the developer and the user. The electronic device 100 may enable the amplifier which is connected to two receivers to be operable based on the streaming video signal having a high priority, and may adjust the gain of the amplifier which is connected to the remaining receivers, excluding the two receivers, to 0 dB. Here, the streaming video signal is received and processed by using two receivers, and the text message signal is received and processed by using one receiver, but it is not limited thereto. In addition, the number of the receivers which is decided in response to each signal may be set differently according to the setting of the developer and the user.

At operation 305, the controller 110 may check the amplifier control condition. Here, the amplifier control condition may be specific conditions which are previously set by the developer and the user. For example, when the received signal is a streaming video data, the developer and the user may set a specific condition based on the data amount (e.g., image quality, image size, play time, etc.) of the streaming video. Further, when a plurality of signals are received simultaneously, the developer and the user may previously set a priority with respect to the plurality of signals. In addition, the developer and the user may previously set the number of the receivers to be used in response to the plurality of signals. Here, the conditions which are set by the developer and the user may be a specific condition.

The controller 110 may decide an amplifier control condition based on the specific conditions which are previously set by the user and the developer, and the amplifier control condition may be stored in the memory (the memory 130 of FIG. 1). There may be a plurality of amplifier control conditions, and the amplifiers which are connected to the receivers may be controlled differently in response to each amplifier control condition. At operation 305, the controller 110 may check the amplifier control condition stored in the memory 130.

At operation 307, the controller 110 may determine whether the amplifier control condition is satisfied based on the status of signal which is checked at operation 303. For example, it can be determined whether the signal can be received and processed by using only a single receiver, or can be received and processed by using two receivers in response to the amplifier control condition.

The embodiment of the present disclosure discloses two receivers, but is not limited thereto. When the electronic device 100 receives the streaming video, the controller 110 of the electronic device 100 may determine whether it corresponds to the amplifier control condition based on the image quality of the streaming video and the communication condition at the present time. That is, the controller 110 may determine the number of the receivers which are necessary to receive and process the video stream uninterruptedly.

When the amplifier control condition is satisfied at operation 307, at operation 309, the controller 110 may adjust the gain of the amplifier which is connected to the receiver in response to the amplifier control condition. For example, when only a single receiver is sufficient to receive and process a signal according to the amplifier control condition, the controller 110 may adjust the gain of the amplifiers (e.g., the LNA, or the PGA) connected to the remaining receivers excluding the single receiver. When two receivers should be used to receive and process the signal according to the amplifier control condition, the controller 110 may adjust the gain of the amplifiers (e.g., the LNA, or the PGA) connected to the remaining receivers excluding the two in-use receivers.

Here, the controller 110 may adjust the gain of the amplifier to 0 dB. In other words, the amplifier control module 113 included in the controller 110 may adjust the gain of the amplifier connected to the remaining receiver, excluding the in-use receivers, to 0 dB. That is, the amplifier control module 113 may adjust the gain of all amplifiers (e.g., the PA, the LNA, and the PGA) built into the electronic device 100. That the gain of the amplifier is adjusted to 0 dB may mean a status in which only a DC voltage is applied minimally to the amplifier adjusted to 0 dB and power is hardly consumed similarly to a status in which the amplifier does not operate. That is, the power consumed by the amplifier (e.g., the PA, the LNA, or the PGA) having the gain adjusted to 0 dB, may be extremely small.

The electronic device 100 according to the present disclosure may control the gain of the amplifier that is not used to receive and process the signal to be 0 dB to minimize power consumed by the electronic device 100. Although not shown, when receiving only a signal, the controller 110 may also adjust the gain of the amplifier (e.g., the PA, or the PGA) which is connected to the transmitter to 0 dB.

At operation 311, the controller 110 may ignore a signal received through the controlled amplifier. That is, the controller 110 may ignore the signal received through the amplifier adjusted to 0 dB.

At operation 313, the controller 110 may combine and process signals excluding the ignored signal.

When the amplifier control condition is not satisfied based on the status of the received signal at operation 307, the controller 110 may combine and process the signals received through the plurality of receivers at operation 315. The method of minimizing power consumption according to various embodiments of the present disclosure and the electronic device 100 for implementing the same may receive signals via a plurality of receivers through a plurality of antennas (the first antenna 121, the second antenna 122 of FIG. 1), and may check the status of signal. The checking of the status of signal may be checking a type of signal, checking a communication environment when receiving a signal, or checking a priority which is previously set by a developer when a plurality of different signals are received.

The electronic device 100 may determine whether the signal satisfies a preset amplifier control condition based on the status of the checked signal. The electronic device 100 may adjust the gain of the amplifier which is connected to the receiver in response to the amplifier control condition when the signal satisfies the amplifier control condition. That is, when the signal can be received and processed by using only a portion of a plurality of receivers, the electronic device 100 may adjust the gain of the amplifier which is connected to the remaining receivers, excluding the in-use portion of the receivers. As a result, the electronic device may adjust the gain of a specific device (e.g., a PA, an LNA, and a PGA) which unnecessarily consumes power to 0 dB, thereby minimizing the power which is unnecessarily consumed through the specific devices. The electronic device 100 according to the present disclosure may minimize power wasted through a non-operational amplifier, thereby using the power of the electronic device 100 efficiently. This may increase user convenience.

According to various embodiments of the present disclosure, at least some of the devices (e.g., modules or functions thereof) or the method (e.g., operations) may be implemented by a command stored in a computer-readable storage media in a programming module form. When the command is executed by one or more processors, the one or more processors may execute a function corresponding to the command. The computer-readable storage media may be, for example, the memory. At least a portion of the programming module may be implemented (e.g., executed) by, for example, the processor. At least a portion of the programming module may include, for example, a module, a program, a routine, sets of instructions, or a process for performing one or more functions.

The computer-readable recording media may include magnetic media such as a hard disk, a floppy disk, and a magnetic tape, optical media such as a compact disc ROM (CD-ROM) and a digital versatile disc (DVD), magneto-optical media such as a floptical disk, and hardware devices specially configured to store and perform a program instruction (e.g., programming module), such as a ROM, a RAM, a flash memory and the like. In addition, the program instructions may include high class language codes, which can be executed in a computer by using an interpreter, as well as machine codes made by a compiler. The aforementioned hardware device may be configured to operate as one or more software modules in order to perform the operation of various embodiments of the present disclosure, and vice versa.

A module or a program module according to various embodiments of the present disclosure may include at least one of the aforementioned elements, omit some elements, or further include additional different elements. Operations performed by the module, the program module or other elements according to various embodiments of the present disclosure may be executed sequentially, in parallel, or iteratively. In addition, some operations may be executed in a different order or may be omitted, or other operation may be added.

The method of minimizing power consumption and the electronic device according to an embodiment of the present disclosure may receive signals via a plurality of receivers, and may check a status of signal. In this case, the checking of the status of signal may include checking a type of signal, checking a communication environment when a signal is received, or checking the priority of signal which is previously set by a developer or a user when a plurality of different signals are received. In addition, the electronic device may determine whether the signal satisfies a preset amplifier control condition based on the status of the checked signal.

The electronic device may adjust the gain of the amplifier which is connected to the receiver in response to the amplifier control condition when the signal satisfies the amplifier control condition. That is, when the electronic device can receive and process the signal even if only a portion of the plurality of receivers is used, the electronic device may adjust the gain of the amplifier which is connected to the other receivers, excluding the in-use portion of the receivers. As a result, the electronic device may minimize unnecessary power consumption by controlling the gain of specific devices (e.g., a PA, an LNA, or a PGA) which consume power unnecessarily.

The electronic device may control the gain of specific devices which do not need to be operated according to a status of signal, thereby minimizing the wasted power of the specific devices. Accordingly, the electronic device may use power more efficiently, and may be operated by user for a longer time. This may increase user convenience.

Various aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include Read-Only Memory (ROM), Random-Access Memory (RAM), CD-ROMs, magnetic tapes, floppy disks, and optical data storage devices. The non-transitory computer readable recording medium can also be distributed over network coupled computer systems so that the computer readable code is stored and executed in a distributed fashion. Also, functional programs, code, and code segments for accomplishing the present disclosure can be easily construed by programmers skilled in the art to which the present disclosure pertains.

At this point it should be noted that various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include Read-Only Memory (ROM), Random-Access Memory (RAM), CD-ROMs, magnetic tapes, floppy disks, and optical data storage devices. The processor readable mediums can also be distributed over network coupled computer systems so that the instructions are stored and executed in a distributed fashion. Also, functional computer programs, instructions, and instruction segments for accomplishing the present disclosure can be easily construed by programmers skilled in the art to which the present disclosure pertains.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of minimizing power consumption of an electronic device, the method comprising:
   receiving a signal through a plurality of receivers of the electronic device;
   checking a status of the received signal;
   determining whether the received signal satisfies a preset amplifier control condition based on the status of the received signal;
   determining whether it is possible for the signal to be received and processed using at least one of the plurality of receivers based on the preset amplifier control condition; and
   adjusting a gain of an amplifier which is connected to other receivers of the plurality of receivers, excluding the used at least one of the plurality of receivers, when it is possible for the signal to be received and processed using the at least one of the plurality of receivers.

2. The method of claim 1, further comprising ignoring a signal which is received through the amplifier having the adjusted gain.

3. The method of claim 1, wherein the checking of the status of the received signal comprises checking a type of the received signal.

4. The method of claim 1, wherein the checking of the status of the received signal comprises checking a communication environment when the signal is received.

5. The method of claim 1, wherein the checking of the status of the received signal comprises checking a priority, which is previously set by a developer and a user, when a plurality of different signals is received.

6. The method of claim 1, wherein the preset amplifier control condition is a condition which is:
   previously set by a developer and a user; and
   used to select amplifiers which would adjust the gain among a plurality of amplifiers connected to the plurality of receivers.

7. The method of claim 1, wherein the adjusting of the gain of the amplifier comprises adjusting the gain of the amplifier to 0 decibel (dB).

8. An electronic device comprising:
   a wireless communication unit including a plurality of receivers, and configured to transmit and receive a signal through the plurality of receivers;
   a memory configured to store a preset amplifier control condition which is previously set by a developer and a user; and
   a controller configured to:
     receive the signal through the plurality of receivers,
     check a status of the received signal,
     determine whether the received signal satisfies the preset amplifier control condition based on the status of the received signal,
     determine whether it is possible for the signal to be received and processed using at least one of the plurality of receivers based on the preset amplifier control condition, and
     adjust a gain of an amplifier which is connected to other receivers of the plurality of receivers, excluding the used at least one of the plurality of receivers, when it is possible for the signal to be received and processed using the at least one of the plurality of receivers.

9. The electronic device of claim 8, wherein the controller is further configured to ignore a signal which is received through the amplifier having the adjusted gain.

10. The electronic device of claim 8, wherein the controller is further configured to check the status of the received signal by checking a type of the received signal.

11. The electronic device of claim 8, wherein the controller is further configured to check the status of the received signal by checking a communication environment when the signal is received.

12. The electronic device of claim 8, wherein the controller is further configured to check the status of the received signal by checking a priority, which is previously set by a developer and a user, when a plurality of different signals is received.

13. The electronic device of claim 8, wherein the controller is further configured to adjust the gain of the amplifier to 0 decibel (dB).

14. A non-transitory computer-readable storage medium storing instructions that, when executed, cause at least one processor to perform the method of claim 1.

* * * * *